United States Patent
Wagner et al.

(10) Patent No.: US 7,402,803 B1
(45) Date of Patent: Jul. 22, 2008

(54) PIXEL ARCHITECTURE FOR THERMAL IMAGING SYSTEM

(75) Inventors: Matthias Wagner, Cambridge, MA (US); Shuyun Wu, Acton, MA (US); Eugene Y. Ma, Newton, MA (US)

(73) Assignee: Redshift Systems Corporation, Burlington, MA (US)

( * ) Notice: Subject to any disclaimer, the term of this patent is extended or adjusted under 35 U.S.C. 154(b) by 165 days.

(21) Appl. No.: 11/448,450

(22) Filed: Jun. 7, 2006

Related U.S. Application Data

(60) Provisional application No. 60/687,938, filed on Jun. 7, 2005.

(51) Int. Cl.
*G01J 5/00* (2006.01)

(52) U.S. Cl. .................................................. 250/338.3

(58) Field of Classification Search ... 250/338.1–338.5, 250/332, 331, 340, 339.01, 339.03
See application file for complete search history.

(56) References Cited

U.S. PATENT DOCUMENTS

| | | | |
|---|---|---|---|
| 5,512,748 | A | 4/1996 | Hanson |
| 6,124,593 | A | 9/2000 | Bly et al. |
| 6,770,882 | B2 | 8/2004 | Carr et al. |
| 6,812,465 | B2 | 11/2004 | Parrish et al. |
| 6,888,141 | B2 | 5/2005 | Carr |
| 2002/0105652 | A1 | 8/2002 | Domash et al. |
| 2003/0087121 | A1 | 5/2003 | Domash et al. |
| 2006/0007386 | A1* | 1/2006 | Cavanaugh et al. ......... 349/202 |

OTHER PUBLICATIONS

Secundo, L. et al., Uncooled FPA with Optical Reading: Reaching the Theoretical Limit:, *Proceedings of the SPIE*, vol. 5783, pp. 483-495, 2005.

Senesac, L. et al., "IR imaging using uncooled microcantilever detectors", *Ultramicroscopy*, vol. 91, pp. 451-458, 2003.

Zhao, J., "High Sensitivity Photomechanical MW-LWIR Imaging using an Uncooled MEMS Microcantilever Array and Optical Readout", *Proceedings of the SPI*, vol. 5783, pp. 506-513, 2005.

Zhao, Y. et al., "Optomechanical Uncooled Infrared Imaging System: Design, Microfabrication, and Performance", *Journal of Microelectromechanical Systems*, vol. 11, No. 2, Apr. 2002.

* cited by examiner

*Primary Examiner*—David P. Porta
*Assistant Examiner*—Kiho Kim
(74) *Attorney, Agent, or Firm*—Wilmer Cutler Pickering Hale and Dorr LLP

(57) ABSTRACT

A thermally tunable pixel element includes a substrate; a thermally tunable filter island; a thermal absorption structure in direct thermal contact with and extending beyond the thermally tunable filter island; and a thermal isolation structure providing a thermally isolating path between the thermal absorption structure and the substrate.

16 Claims, 15 Drawing Sheets

PIXEL ARCHITECTURE FOR THERMAL IMAGING SYSTEM

CROSS-REFERENCE TO RELATED APPLICATIONS

This application claims the benefit of U.S. Provisional Patent Application Ser. No. 60/687,938, filed Jun. 7, 2005, the entire contents of which are incorporated herein by reference.

FIELD OF THE INVENTION

This invention generally relates to thermal imaging systems.

BACKGROUND

The market for thermal imaging systems is large and growing quickly, and is driven by military, security, medical, construction, and automotive markets. Thermal imaging systems typically image thermal wavelengths that scenes at "normal" environmental temperatures, e.g., room or body temperature, radiate. Useful wavelengths for imaging applications include those that the atmosphere readily transmits, and that are not overwhelmed by radiation of the same wavelength from the sun. Thus, thermal imaging systems typically image long wavelength infrared radiation (LWIR), e.g., wavelengths in the range of 7 to 15 microns, that a scene radiates.

Systems that image long wavelength infrared radiation from scenes include narrow-bandgap semiconductor photodetector arrays, which typically require cryogenic cooling, and uncooled microbolometer arrays. These kinds of systems are typically so expensive as to make them inaccessible for the majority of commercial and consumer markets. Additionally, the low yield in producing the array elements for these kinds of systems, and the resulting high cost of manufacturing them, makes it impractical to build high-resolution systems for any but the most cost-insensitive uses.

SUMMARY

A thermal imaging system with optical readout includes thermally tunable pixel elements that generate an image of a scene. The scene radiates infrared radiation, which locally heats the thermally tunable pixel elements with a spatial distribution that corresponds to the scene's thermal characteristics; the local heating changes the reflectivity of the pixel elements. Then, the thermally tunable pixel elements reflect an optical carrier beam with an intensity distribution that corresponds to the local heating that the scene radiation induces, transferring information about the scene to the carrier beam, which the system then images onto a CCD or CMOS detector array. The pixel elements have an improved architecture that includes separate structures for the thermal absorption, structural support, thermal isolation, and carrier beam modulation functions. This allows the structures to be tailored to perform their particular function. The architecture also reduces the relative size of the structure that modulates the carrier beam; because the structure has a relatively large thermal mass, reducing its size reduces the pixel's thermal mass and thus enables its sensitivity or response speed to be improved.

Under one aspect, a thermally tunable pixel element includes a substrate; a thermally tunable filter island; a thermal absorption structure in direct thermal contact with and extending beyond the thermally tunable filter island; and a thermal isolation structure providing a thermally isolating path between the thermal absorption structure and the substrate.

The thermally tunable pixel element may also include one or more of the following features. A plurality of filter islands, wherein the first mentioned filter island is one of the plurality. A thermally isolating trench between each filter island of the plurality of filter islands. A space between the substrate and the thermal absorption structure. The space has a thickness that is about ¼ of a thermal wavelength of interest. A patterned reflective layer that reflects at least the thermal wavelength of interest. A patterned absorbing layer, at least a portion of which absorbs light irradiating the pixel element. The patterned absorbing layer includes an aperture that transmits light irradiating the pixel element. The thermally tunable filter island includes a thermally tunable thin film interference filter. The thermal absorbing structure comprises silicon dioxide, silicon nitride, or a mixture thereof. The thermal absorbing structure comprises a thin metal film.

The thermally tunable pixel element may also include one or more of the following features. The thermal absorption structure supports the filter island from below. The thermal absorption structure supports the filter island from above. The filter island has a smaller area than the thermal absorption structure. The thermal isolation structure includes a support arm for the thermally tunable filter island and thermal absorption structure. The thermal isolation structure comprises a plurality of support arms for the thermally tunable pixel filter island and thermal absorption structure. The thermal isolation structure includes a patterned portion of the thermal absorption structure. The thermal isolation structure includes a thermally isolating post.

DETAILED DESCRIPTION

Thermal imaging systems with optical readouts utilize an array of thermally tunable pixel elements. The optical properties of the pixel elements change according to heating caused by thermal radiation from a scene. A carrier beam irradiates and reflects from the array, and the array's thermally tuned optical properties modify one or more carrier beam characteristics. This transfers thermal information about the scene onto the carrier beam. The system then optically reads out the modified carrier beam, typically using a CMOS or CCD detector array.

Figure 1:
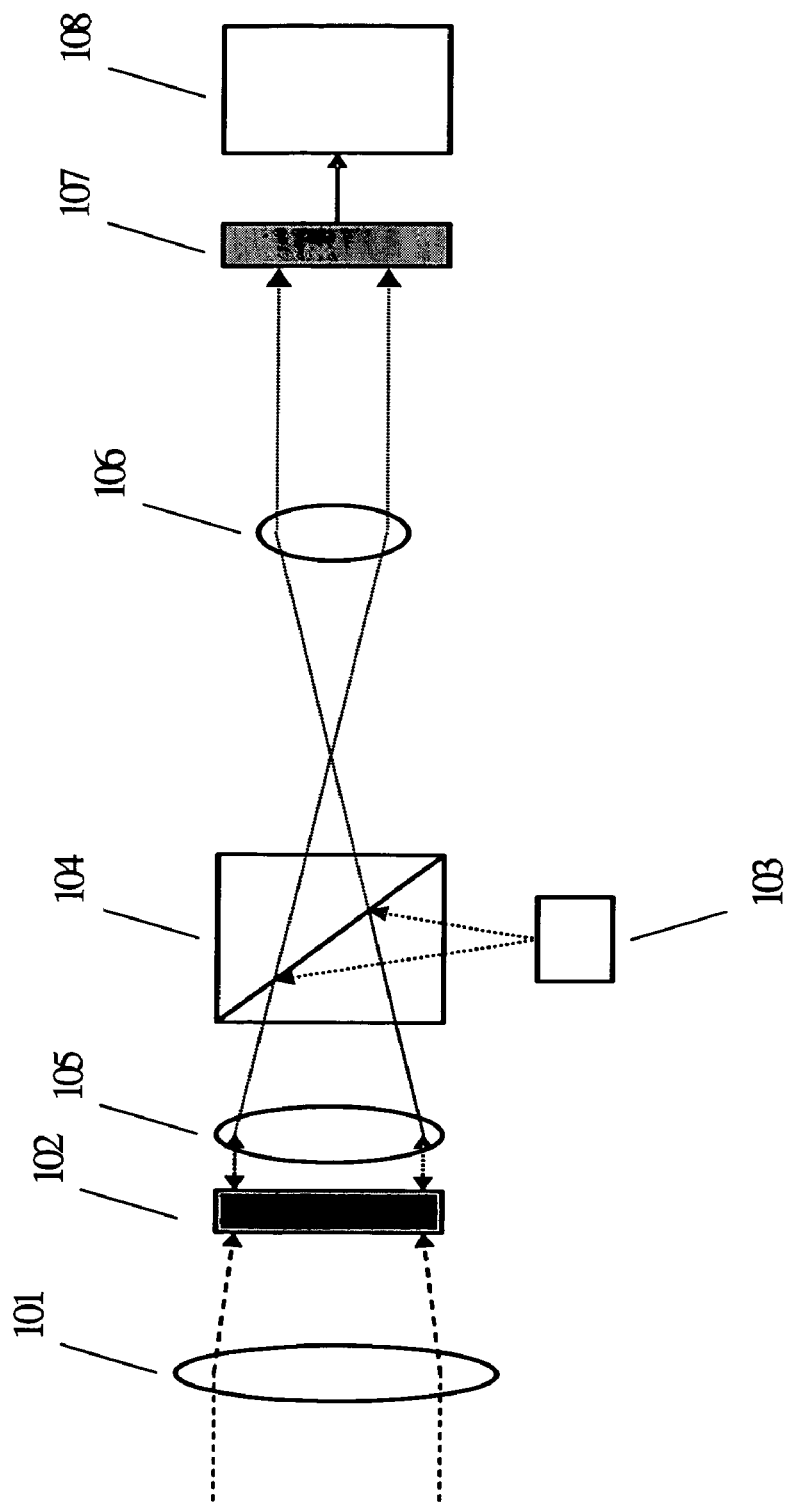
FIG. 1 illustrates a reflection-mode thermal imaging system with thermally tunable pixel elements and optical readout.

FIG. 1 illustrates a reflection-mode thermal imaging system. A long-wavelength (LWIR) lens 101 images a scenes LWIR radiation, shown as a dashed line, onto a "thermal light valve" (TLV) thermal sensor array 102. The LWIR radiation heats local areas of the TLV differently, according to the thermal characteristics of the scene. This modifies the local reflectivity of the TLV, as described in greater detail below. Separately, a near-infrared (NIR) laser subsystem 103 generates a carrier beam, shown as a dotted line. Beamsplitter 104 directs part (e.g., half) of the carrier beam through collimating lens 105, and onto the rear surface of TLV 102. The rear surface of the TLV reflects the carrier beam with an intensity that varies in space according to the local temperature of each portion of the TLV. This transfers thermal information about the scene onto the carrier beam. Lens 105 and beamsplitter 104 re-transmit the reflected and modulated carrier beam. Then, lens 106 images the modulated carrier beam onto CMOS or CCD detector array 107. Detector array 107 converts the carrier beam into an electrical signal, which hardware and software 108 process to produce a two-dimensional image of the thermal radiation from the scene. Note that FIG. 1 and all subsequent figures are not drawn to scale but are rather intended to be illustrative of the described concepts.

Figure 2A:
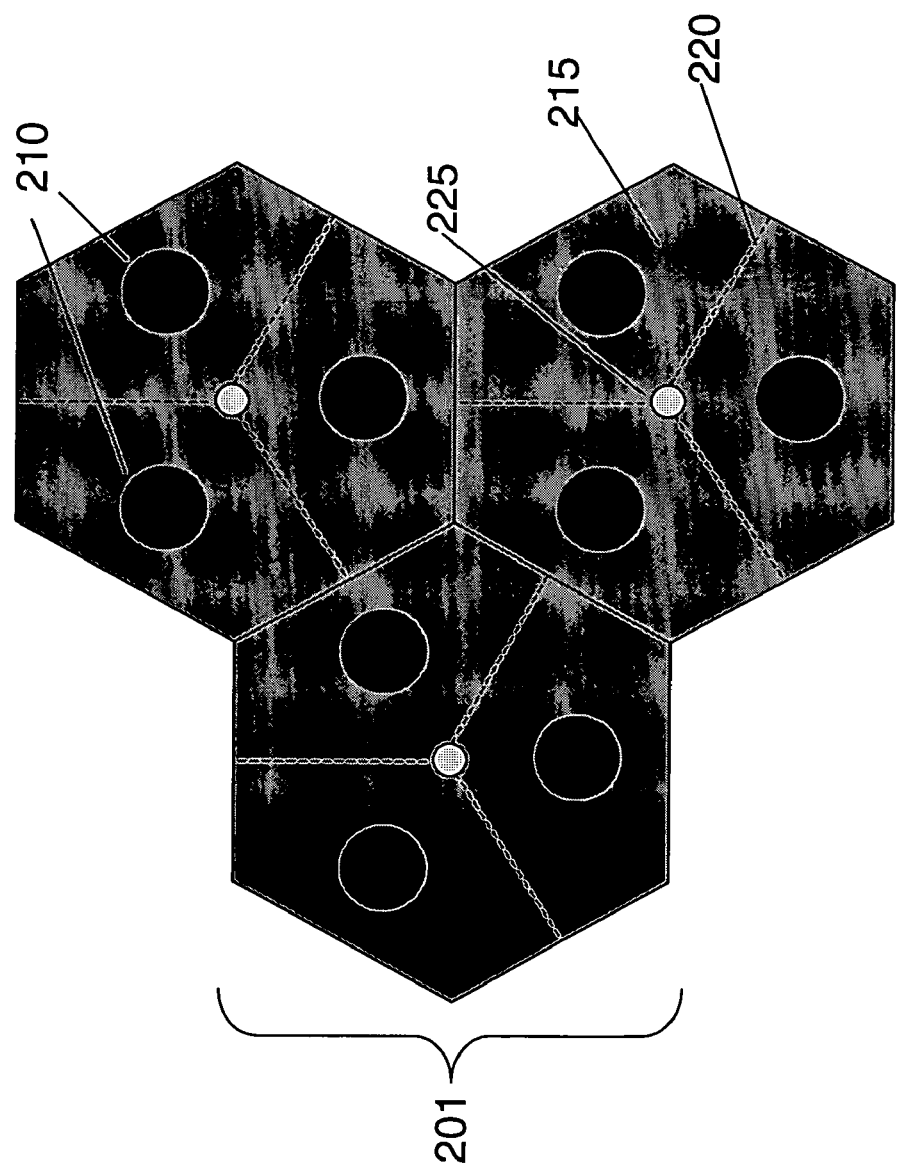
FIG. 2A illustrates a plan view of an array of thermally tunable pixel elements.

FIG. 2A illustrates a plan view of an array of a TLV architecture for use in the system of FIG. 1. The TLV includes a patterned array of thermally tunable pixel elements 201. Each thermally tunable pixel element 201 includes LWIR absorbing structure 215, three thermally tunable filter islands 210, thermally isolating post 225, and thermally isolating trenches 220. The centers of the pixel elements are about 30 μm apart, and the filter islands are about 17 μm apart, although other appropriate spacings can be used.

LWIR absorbing structure 215 absorbs thermal radiation from the scene. The LWIR radiation intensity varies in space according to the particular thermal characteristics of the scene, and these variations create corresponding local temperature variations in the different pixel elements 201. This heating changes the optical properties of filter islands 210, which each include a thermally tuned, thin film interference filter. Specifically, the heating causes a change in the refractive index of filter islands 201, which slightly shifts their NIR (i.e., carrier beam) bandpass. When the carrier beam reflects from TLV 102, the thermally induced shift in the bandpass of filter islands 201, relative to the carrier beam wavelength, modulates the intensity of the reflection. The carrier beam's two-dimensional intensity variations thus directly relate to the scene's thermal radiation.

Figure 2B:
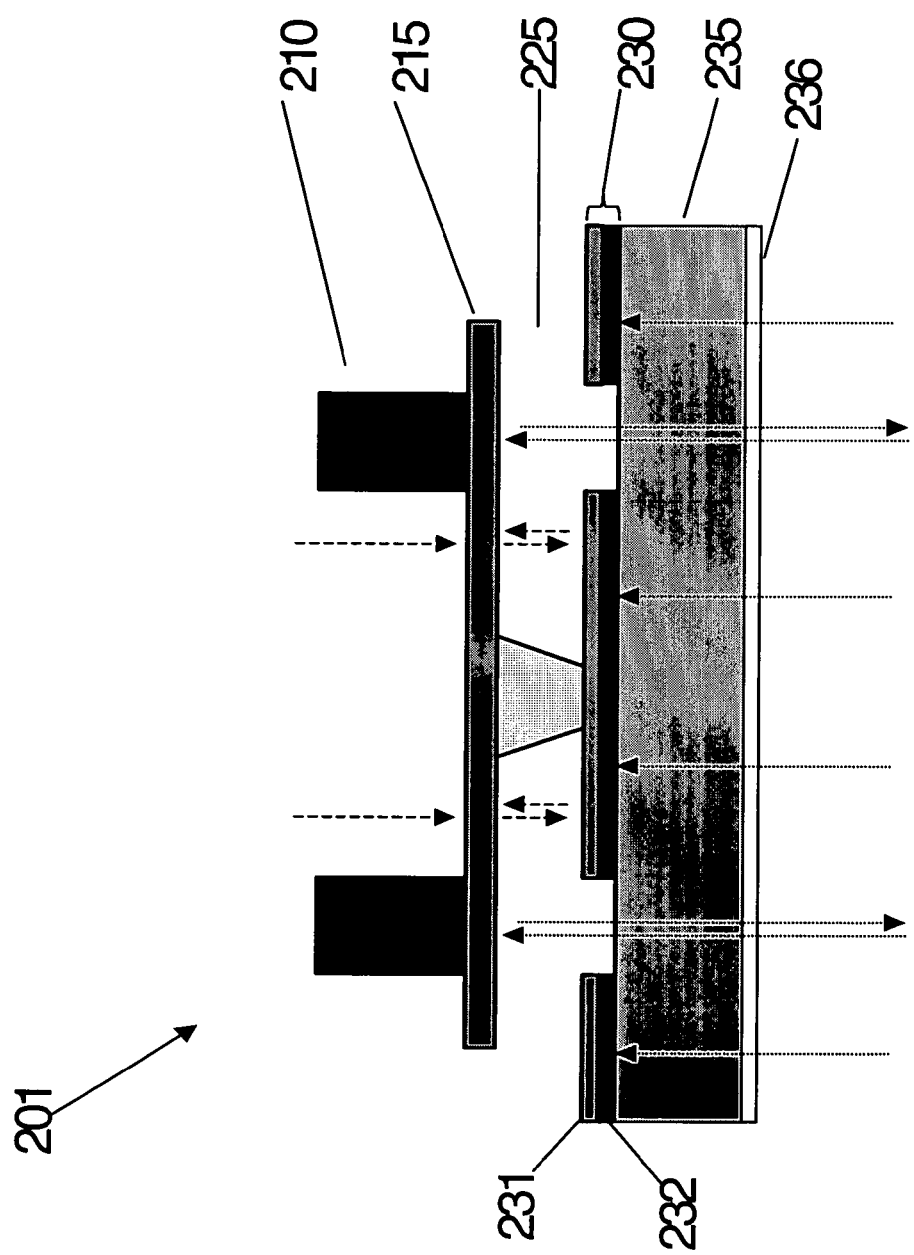
FIG. 2B illustrates a side view of a single thermally tunable pixel element of FIG. 2A.

FIG. 2B illustrates a side view of a single thermally tunable pixel element 201, relative to incoming LWIR radiation (dashed line) and the carrier beam (dotted line). Thermally isolating post 225 supports LWIR absorbing structure 215 and thermally tunable filter islands 210, separating them from underlying substrate 235 by a spacing 225. LWIR absorbing structure 215 absorbs LWIR radiation from the scene, but is transparent to the carrier beam. The underlying substrate 235 further includes mask 230, which has a reflective layer 231 and an absorptive layer 232. Reflective layer 231 reflects any initially unabsorbed LWIR radiation back to LWIR absorbing structure 215, helping the absorbing structure 215 capture additional thermal radiation. Spacing 225 enhances this absorption for LWIR wavelengths that are resonant with the spacing, i.e., that irradiate LWIR absorbing structure 215 in the same place both before and after reflection from reflective layer 231. Absorptive layer 232 allows the carrier beam to irradiate filter islands 210, but absorbs the majority of the rest of the carrier beam. This proportionally increases the LWIR-dependent signal in the carrier beam relative to the total beam power that arrives at the detector array. Substrate 235 also includes antireflection (AR) coating 236, which reduces stray reflections of the carrier beam from the bottom of the substrate. These reflections would otherwise appear as artifacts at the CCD, potentially obscuring the actual image of the scene.

Figure 3:
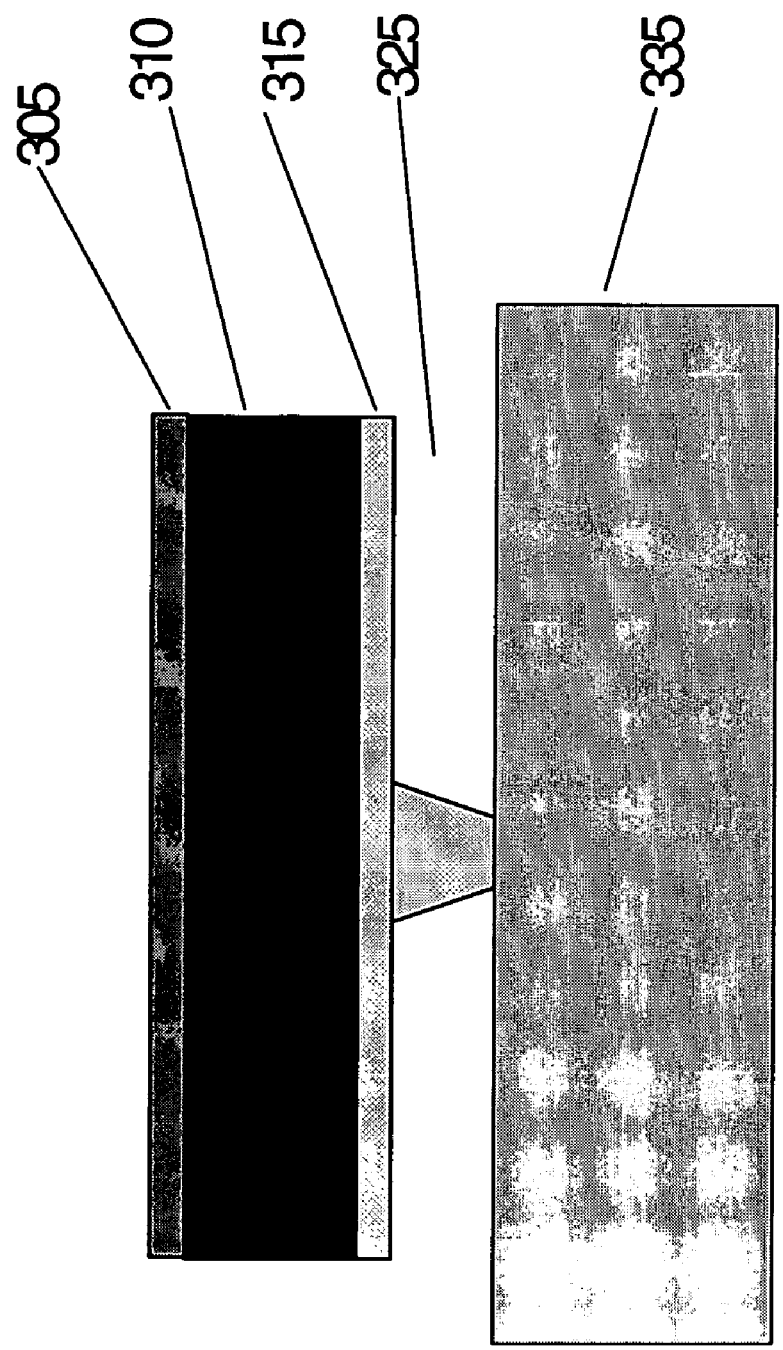
FIG. 3 illustrates a side view of a previous design for a thermally tunable pixel element.

As a point of comparison, FIG. 3 illustrates a side view of an earlier pixel design, which is described in greater detail in U.S. Patent Publication No. 2005/0082480, the entire contents of which are incorporated herein by reference. Pixel element 301 includes LWIR absorbing layer 305, thermally tunable filter 310, structural support 315, spacing 325, post 340, and substrate 335, which perform similar functions to the elements described above. However, in pixel 301, LWIR absorbing layer, filter 310, and structural support 315 coextend along the majority of the surface of pixel 301, essentially forming a single structure.

The performance of a thermally tunable pixel, e.g., pixel 201 of FIGS. 2A-2B or pixel 301 of FIG. 3, is related to a number of parameters, including the efficiency with which it absorbs LWIR radiation; its thermal isolation, which determines the temperature increase that the absorption causes; its thermal mass; and the change in carrier beam signal per change in pixel temperature as measured at the CCD detector array. The time response of the pixel is related to its thermal mass multiplied by its thermal isolation. It is possible to improve the conversion of LWIR absorption by increasing the pixel's thermal isolation of the pixel, but this results in a slower response. On the other hand, the thermally tunable filter can be redesigned to provide a stronger thermal response, but this usually adds thermal mass to the pixel, e.g., by adding more filter layers.

This combination of parameters significantly limits the performance of pixel 301, because thermally tunable filter 310, which has a relatively large thermal mass, covers the majority of the pixel surface. Additionally, the filter 310 is designed to modulate the carrier beam, and thus is typically non-ideal for absorbing LWIR radiation. This means adding LWIR absorbing layer 305, which further increases the thermal mass of the pixel 301.

In contrast, thermally tunable pixel element 201 of FIGS. 2A and 2B has "separate" structures that each perform separate functions, e.g., LWIR absorption, carrier beam modulation, thermal isolation, and structural support. By "separate" we mean that they function relatively independently of each other, despite the fact that they are joined together. For example, LWIR absorbing structure 215 is independent of, and extends beyond, thermally tunable filter islands 210. This allows the two structures to be individually fabricated using materials and designs that enhance their respective functionalities.

For example, the LWIR structure's absorption of radiation can be improved by adjusting (a) the composition of the layer, (b) the optical thickness of the layer, (c) the position of the layer relative the surface of the substrate to create appropriate optical interferences, and (d) the optical properties of layers on the substrate, which reflect unabsorbed LWIR radiation back to the LWIR absorbing layer. An example of such a structure includes a layer of silicon oxide and/or silicon nitride, positioned over the substrate by ¼ of the wavelength of interest. Because the LWIR absorption functionality is separate, for example, from the thermal isolation functionality, the LWIR structure's parameters can be changed without necessarily changing the thermal characteristics of the pixel. Or, if changing an LWIR parameter does negatively affect the pixel's thermal characteristic, the thermally isolating structure can be changed to compensate for that without itself detrimentally affecting the LWIR absorption. In other words, the architecture limits the coupling between the performance of different structures with different functions. In pixel 301 of FIG. 3, the functionalities of the different layers are strongly coupled to each other much more strongly.

Separating functional structures provides an additional benefit in that it is possible to create a regular optical pattern of filter islands that is not constrained by the mechanics or thermal structures of the pixel. For example, it is straightforward to create a regular triangular or square matrix of filter islands (and corresponding apertures). This helps to ease optical constraints on the system as a whole, as well as requirements for subsequent signal processing. Limiting the filter islands to smaller areas also provides space to incorporate new features into the pixel, such as thermally isolating trenches.

The design also makes it possible to use multiple filter patches semi-independently, resulting in better pixel resolution. For example, thermally isolating post 215, which has a low thermal diffusion constant, and space 225 thermally separate pixel element 201 from adjacent pixel elements, as well as from the underlying substrate 235. These features help to contain heat within LWIR absorbing structure 215 and filter islands 210, thus increasing carrier beam modulation and improving image quality. This thermal isolation helps to prevent thermal "cross-talk" between different regions of the TLV, i.e., different pixels, so that heat that the scene radiation generates on one pixel does not readily transfer to another pixel via thermal conduction and smear the image. Thermally isolating trenches 220, shown in FIG. 2A also thermally isolate filter islands 210 from each other, which further reduces smearing of the image and thus improves resolution.

Additionally, the filter islands 210 of FIG. 2B are relatively small, as compared with the filter 310 of FIG. 3. Because these elements are thick relative to the rest of the pixel, and thus have a large relative thermal mass, reducing their size reduces the total thermal mass of the pixel. Reducing the pixel's thermal mass, i.e., reducing the amount of material that the thermal radiation heats, translates directly into a higher pixel response speed. For example, assume that a filter layer has ten times the unit mass of an LWIR absorbing layer. Thus, reducing the size of the filter areas to 20% of the entire pixel area (as compared to 100% of the pixel area as for pixel 301), results in a 3.7 times smaller thermal mass. This translates directly into a faster thermal response speed, which by adjusting the thermal isolation of the pixel translates to a 3.7 times higher pixel sensitivity.

Figure 4A:
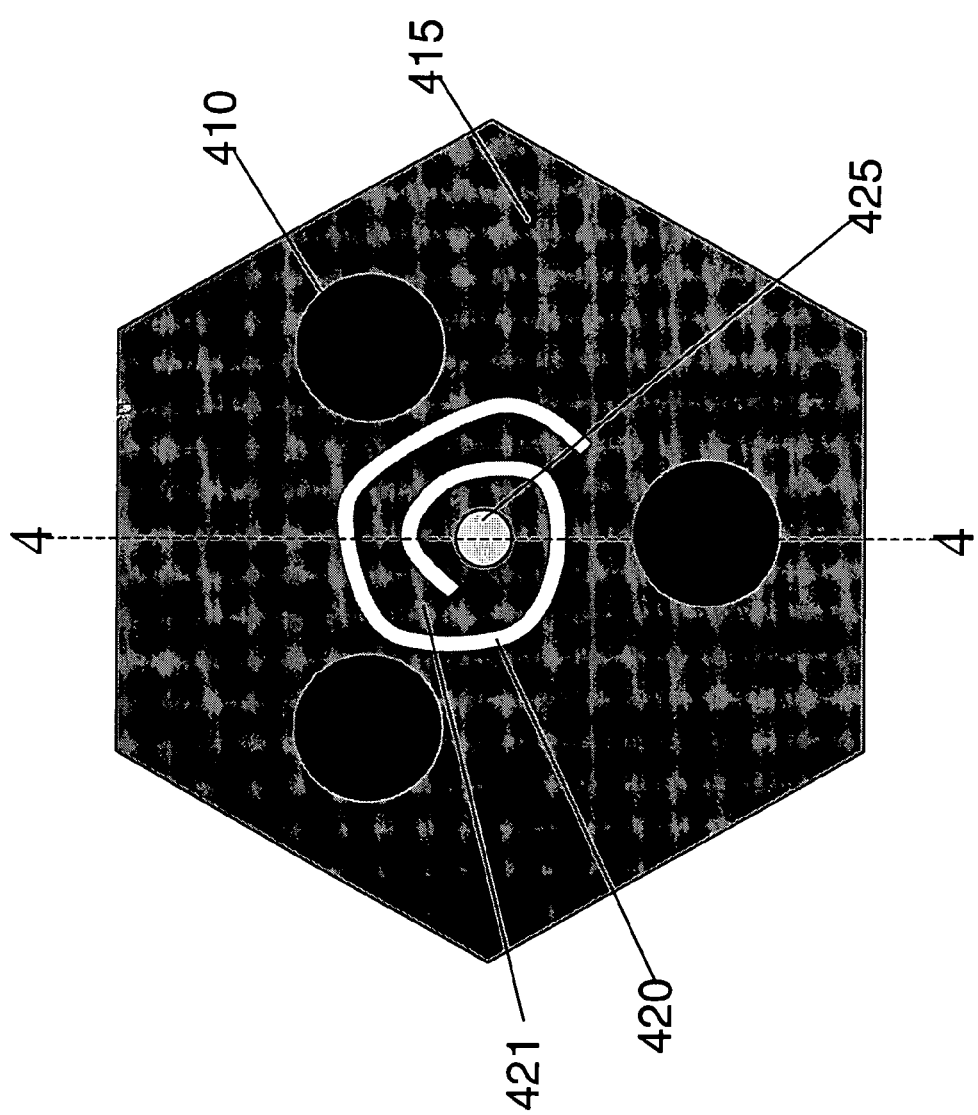
FIG. 4A illustrates a plan view of an alternative design for a thermally tunable pixel element.

FIG. 4A illustrates a plan view of an alternate design for a thermally tunable pixel element 401. Pixel element 401 includes LWIR absorbing structure 415, three thermally tunable filter islands 410, post 425, cavity 420, and thermally isolating support arm 421. Support arm 421 is long and thin, and therefore transports heat relatively poorly. This thermally isolates the upper surface of pixel element 401, e.g., LWIR absorbing structure 415 and filter islands 410, from post 425 and from the underlying substrate (not shown). In this design, post 425 need not be thermally isolating, because support arm 421 provides thermal isolation. The length, width, and pattern of support arm 421 are selected to provide an appropriate balance of thermal isolation and structural support to pixel element 401.

Figure 4B:
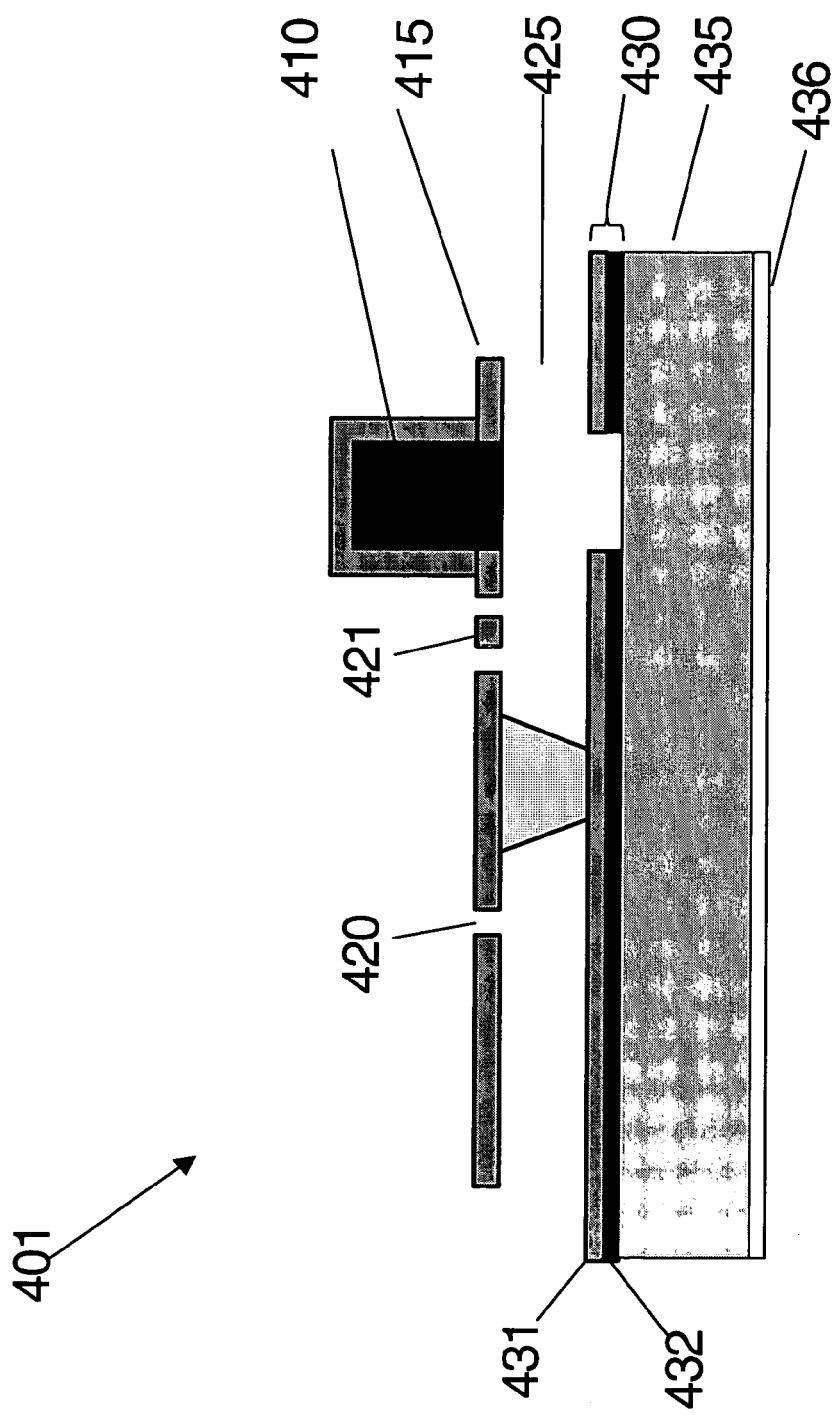
FIG. 4B illustrates a side view of the thermally tunable pixel element of FIG. 4A.

FIG. 4B illustrates a side view of the pixel element 401 of FIG. 4A, taken along line 4-4. Thermally isolating support arm 421, connected to post 425, supports LWIR absorbing structure 415 and filter islands 410. In this design, LWIR absorbing structure 415 overlays filter islands 410, holding them from above and separating them from underlying substrate 435 by spacing 425. The underlying substrate 435 also includes antireflective coating 436 and mask 430, which includes reflecting layer 431 and absorbing layer 432, which have the same functions those described regarding FIG. 2B.

Figure 5A:
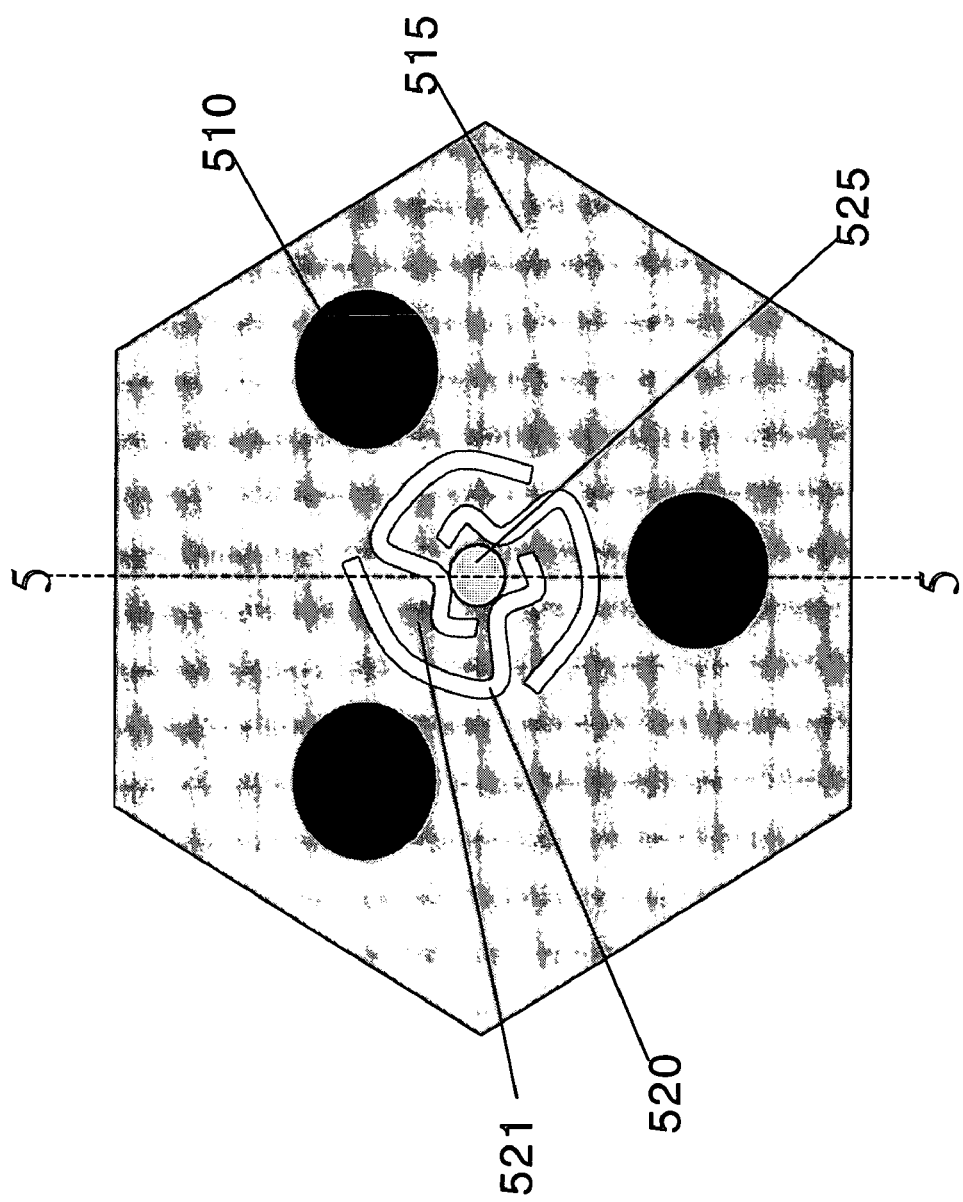
FIG. 5A illustrates a plan view of a second alternative design for a thermally tunable pixel element.

FIG. 5A illustrates a plan view of a second alternate design for a thermally tunable pixel element 501. Pixel element 501 includes LWIR absorbing structure 515, three thermally tunable filter islands 510, and post 525. This design, however, includes three cavities 520 and three thermally isolating support arms 521. As for pixel element 401 of FIG. 4A, support arms 521 are long and thin, transporting heat relatively poorly and thus thermally isolating LWIR absorbing structure 515 and filter islands 510 from post 525 and from the underlying substrate (not shown). Here the three support arms 521 extend symmetrically from post 525, which enhances the balance and structural stability of the pixel relative to the single asymmetric support arm illustrated in FIG. 4A.

Figure 5B:
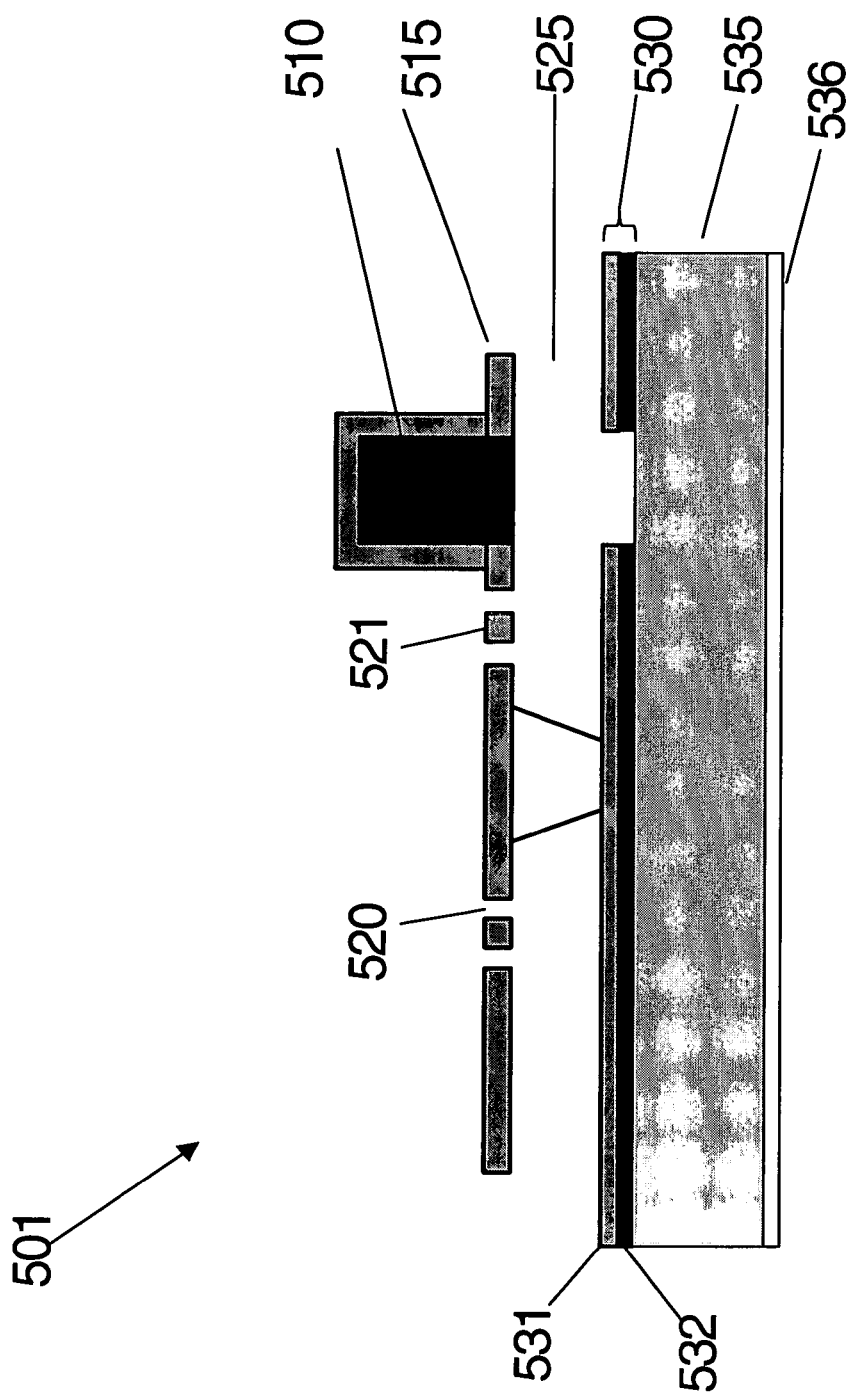
FIG. 5B illustrates a side view of the thermally tunable pixel element of FIG. 5A.

FIG. 5B illustrates a side view of the pixel element 501 of FIG. 5A, taken along line 5-5. Thermally isolating support arms 521, connected to post 525, support LWIR absorbing structure 515 and filter islands 510. Pixel 501 also includes substrate 535, antireflective coating 536, spacing 525, and mask 530, having reflecting layer 531 and absorbing layer 532, each of which have substantially the same function as those described above.

Figure 6:
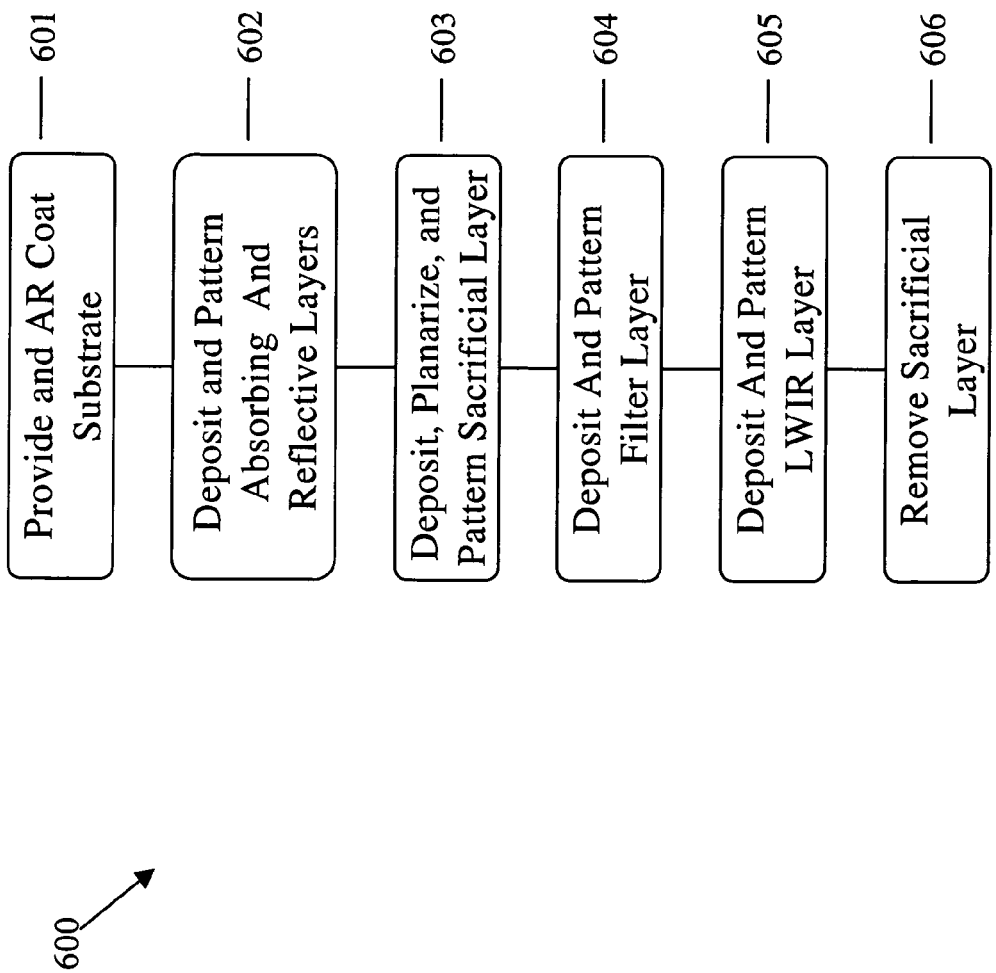
FIG. 6 illustrates a flow chart of a method of making the thermally tunable pixel elements of FIGS. 4A-4B and 5A-5B.

FIG. 6 illustrates a flow chart of a method 600 of making the thermally tunable pixel elements of FIGS. 4A-4B and FIGS. 5A-5B. The intermediate structures formed, and materials used, are described in greater detail below. The first step of the method provides a substrate and coats one side of it with an antireflective (AR) coating (601). The next step deposits absorbing and reflective layers on the other side of the substrate from the AR coating and patterns them (602). This form an aperture that will transmit the carrier beam to the filter islands in the finished structure. The next step deposits, planarizes, and patterns a sacrificial layer (603) over the absorbing and reflective layers. The sacrificial layer defines the space between the substrate and the upper pixel structure, e.g., the filter islands and LWIR structure, and the pattern in the sacrificial layer provides a hole in which the post will be fabricated. The next step deposits and patterns the filter layer (604) over the sacrificial layer. This forms the post and the filter islands. The next step deposits and patterns LWIR absorbing layer (605) over the patterned filter layer, separating the pixel from adjacent pixels in the array and forming thermally isolating supporting arm(s). The last step removes the sacrificial layer (606) to form the finished pixel. The different steps in the method can be performed using techniques known in the fields of photolithography and thin film deposition, and are therefore not discussed here in detail.

Figure 7A:
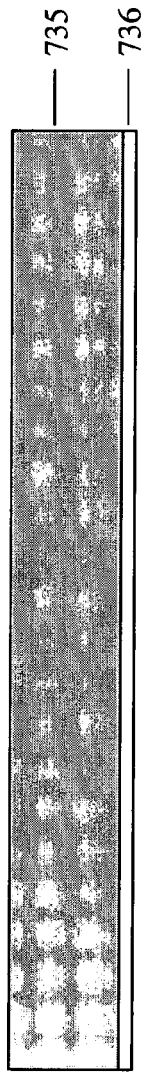
FIGS. 7A-7G illustrate a side view of intermediate structures formed during fabrication of the thermally tunable pixel element of FIGS. 4A-4B.

FIGS. 7A-7G illustrate intermediate structures formed during the different steps of the method of FIG. 6. As illustrated in FIG. 7A, the first step (601) provides a substrate 735 and coats one side of it with an AR coating 736. Here, substrate 735 is glass, which readily transmits the carrier beam and is relatively inexpensive, although other materials that transmit the carrier beam can be used. AR coating 736 is optimized to minimize the carrier beam's reflection at the substrate-air interface, on the bottom of the substrate. Without the AR coating, a non-negligible percentage of the carrier beam would reflect from the interface upon its arrival at the interface, as well as upon its return after reflecting from the filter island. These stray reflections would appear as bright artifacts in the image of the scene.

Figure 7B:
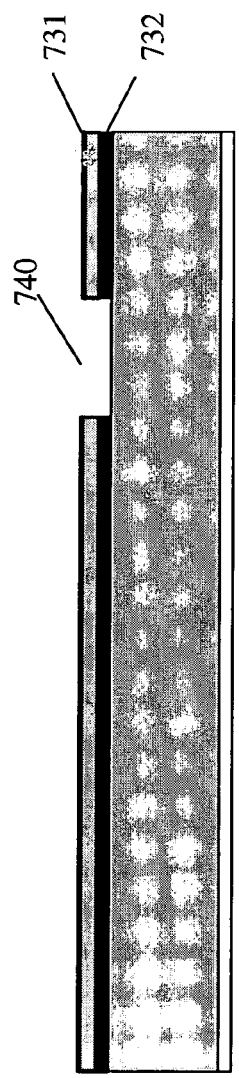

FIG. 7B illustrates absorbing layer 732 and reflective layer 731, which the next step (602) sequentially deposits and patterns on the other side of the substrate from the AR coating. Absorbing layer 732 has a composition and thickness selected to absorb the carrier beam, e.g., NIR radiation, to further reduce the amount of light reaching the CCD that does not contain information about the scene. Reflective layer 731 has a composition and thickness selected to reflect thermal radiation from the scene, so that radiation that the LWIR absorbing structure does not initially absorb can be absorbed on a second pass through the LWIR absorbing structure. The pattern in absorbing layer 732 and reflective layer 731 includes aperture 740, which in the finished structure will selectively transmit the carrier beam only where it will interact with the filter islands and thus receive information about the scene.

Figure 7C:
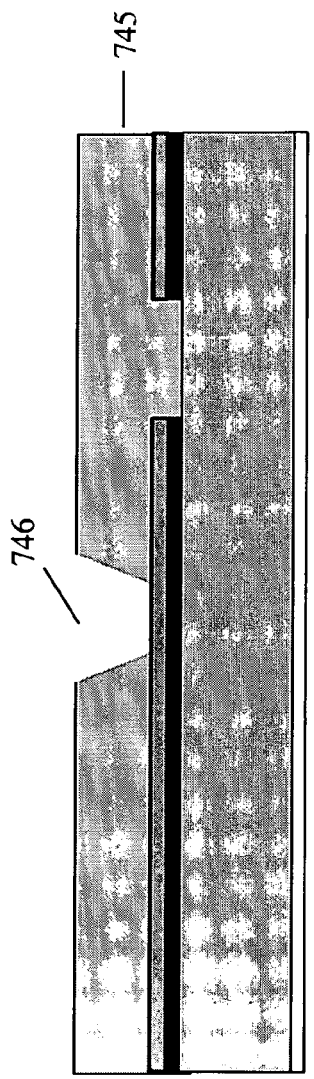

FIG. 7C illustrates the intermediate structure that step (603) forms by depositing, planarizing, and patterning sacrificial layer 746. When step (603) deposits sacrificial layer 746, the layer conforms to the underlying structure, e.g., fills in aperture 740 in the underlying absorbing and reflective layers. This creates a corresponding depression in the upper surface of sacrificial layer 746; planarizing the layer eliminates this depression, so that any structures deposited on top of layer 746 will see a planar surface. As mentioned above, sacrificial layer 746 defines the space between the substrate and the upper pixel structure, e.g., the filter islands and LWIR absorbing structure; in other words, the space will have the same thickness as sacrificial layer 746 has after planarization. A thickness of ¼ the thermal wavelength of interest helps the LWIR absorbing structure absorb that wavelength in the finished pixel. The pattern in sacrificial layer 745 provides hole 746 in which the post will be deposited. Later, after other steps fabricate the filter islands, LWIR absorbing structure, and post, a last step will remove sacrificial layer 745. In essence, the sacrificial layer's role is to allow the definition of other structures, even though it is not a part of the finished structure. Polyimide is an example of a suitable material for use in sacrificial layer 745, which has a higher etch rate than that of the other materials in the structure, allowing it to be later removed without damaging the rest of the pixel.

Figure 7D:
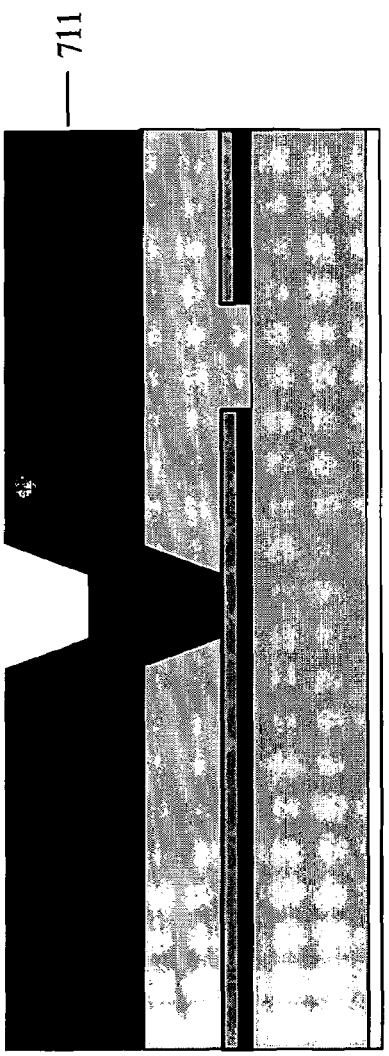
Figure 7E:
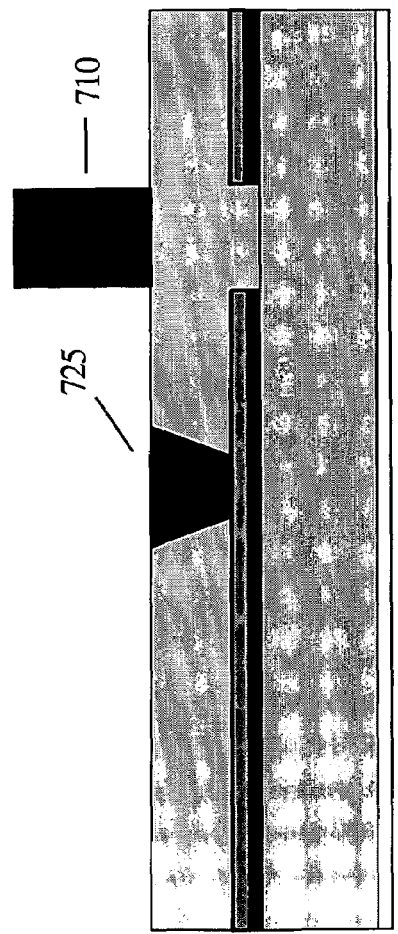

FIGS. 7D and 7E show different intermediate structures that step (604) creates. First, as FIG. 7D illustrates, step (604) deposits the filter layer 711 over the patterned and planarized sacrificial layer 745. The filter layer incorporates semiconductor materials with a refractive index that depends strongly on temperature to create a solid-state, tunable thin film optical filter. See, for example, U.S. Patent Publications No. 2002/0105652 and 2003/0087121, the entire contents of which are incorporated herein by reference. Here, filter layer 711 includes first and second reflecting structures with a spacer between them. The first and second reflecting structures each include 4 layers of amorphous silicon, which has a relatively high refractive index, alternating with 4 layers of silicon nitride, which has a relatively low refractive index. Each layer in the reflecting structure has a thickness corresponding to ¼ of the wavelength of the carrier beam light in that layer, e.g., ¼ of 850 nm, divided by the refractive index of the layer. So, the amorphous silicon layers are each (212.5 nm/3.6), or about 59 nm thick, and the silicon nitride layers are each (212.5 nm/1.8), or about 108 nm thick. The spacer between the first and second reflecting structures is amorphous silicon with a thickness corresponding to the wavelength of the carrier beam light in that layer, e.g., 850 nm divided by the refractive index of amorphous silicon, or about 161 nm. This yields a total filter layer 711 thickness of about 1500 nm. As FIG. 7D illustrates, filter layer 711 conforms to the pattern of sacrificial layer 745, filling in post hole 746.

FIG. 7E illustrates the next part of step (604), which is patterning the filter layer 711 to form the post 725 and filter islands 710. Although the filter layer has optical properties tailored to provide thermally tunable optical (or thermo-optic) modulation of the carrier beam, it is also mechanically robust. This makes it a good option for use as the post material, which, as discussed above, does not need to be thermally isolating in this design because other structures provide thermal isolation in the pixel. Although it is not illustrated, the filter material can be patterned so that it extends beyond the edge of the post hole and over a portion of the sacrificial layer; this extra material can add additional structural stability to the finished structure. Forming the post 725 and filter islands 710 concurrently also saves time and energy over fabricating them separately, out of separate materials. As FIG. 7E illustrates, step (604) patterns filter islands 710 directly above the aperture 740 in the absorbing layers 732 and reflecting layers 731.

As FIG. 7E illustrates, step (605) first deposits LWIR absorbing layer 715 over the filter islands 710, post 725, and sacrificial layer 726. LWIR absorbing layer conforms to the underlying structures. The material used in LWIR absorbing layer 715, and the thickness thereof, absorbs thermal radiation relatively well, has a relatively low thermal conductivity, and also has a sufficient mechanical strength that the thermally isolating arm of the final structure adequately supports the filter islands. The illustrated LWIR absorbing layer is a 200 nm layer of silicon nitride, although silicon dioxide, as well as mixtures of silicon dioxide and silicon nitride, can be used. These materials typically have bond vibrations at frequencies that resonate with LWIR radiation, allowing them to absorb light. Alternately, a very thin metal layer, such as titanium or chromium, can also be used as an LWIR absorber even though it absorbs LWIR by a different mechanism. In general, a material with a resistance of about 377 ohms/square (i.e., the resistance of free space) will absorb LWIR radiation particularly well, although the other features of the material must be taken into account. For example, thin metal layers tend to inherently have high stress, which could cause warping in the pixel, and in some cases can also have an undesirably high thermal conductance.

Figure 7F:
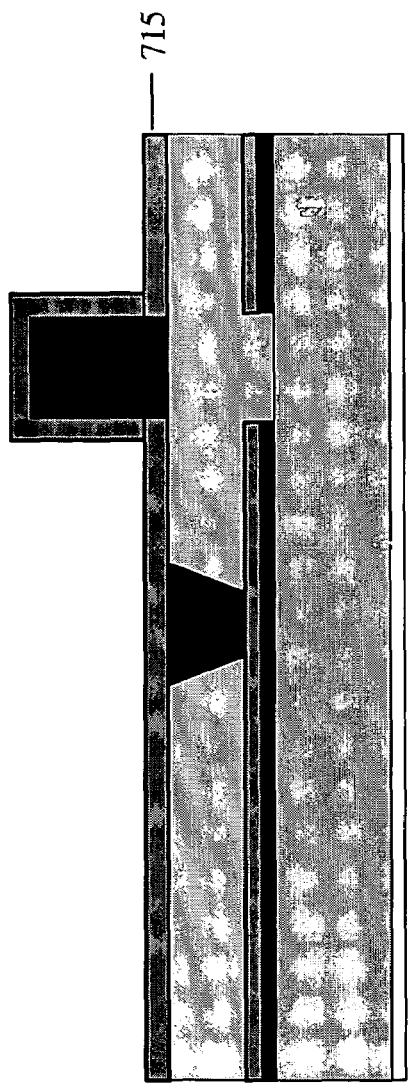
Figure 7G:
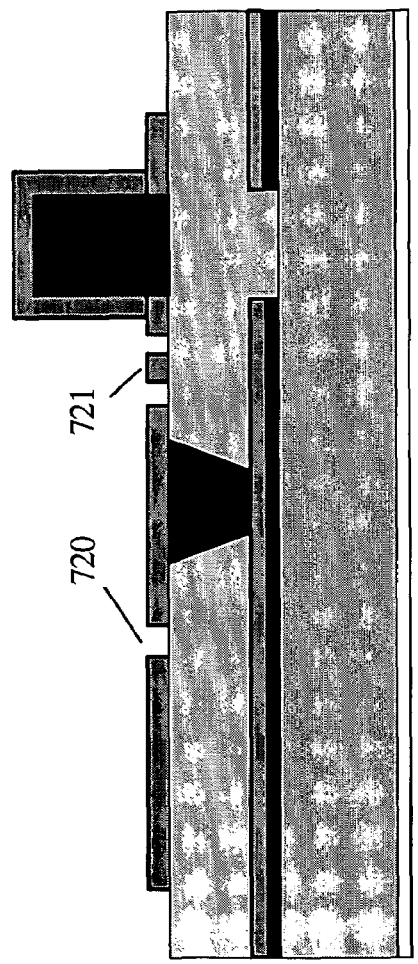

Then, as FIG. 7F illustrates, step (605) patterns, e.g., lithographically defines a pattern in LWIR absorbing layer to separate the pixel from adjacent pixels in the array, to form cavities 720, and to form thermally isolating support arm 721. Note that in this step, because the patterns of cavities 720 and thermally isolating support arm 721 are lithographically defined, selecting a different pattern allows a different thermally isolating structure to be fabricated. In other words, only a minor modification to the step allows substantial revision to the structure's thermal characteristics.

Step (606) then removes the sacrificial layer 745, e.g., by etching, to form the finished pixel illustrated in FIGS. 4A-4B. Note that cavities 720 provide an additional pathway for an etchant to remove the sacrificial layer, making it faster to remove the layer and thus reducing potential damage to other structures in the pixel. In contrast, in earlier designs such as pixel 301 of FIG. 3, the etchant would only be able to access the sacrificial layer by grooves defining the outer edges of the pixel.

The pattern illustrated in FIG. 7F can be varied to form different sizes and shapes of cavities and thermally isolating support arm(s), to provide the desired balance of thermal isolation and structural integrity. For example, the pixel of FIGS. 5A-5B can be fabricated using the steps described above regarding FIGS. 7A-7F, but simply using a different pattern that provides a more symmetrical support to the filter islands.

Figure 8:
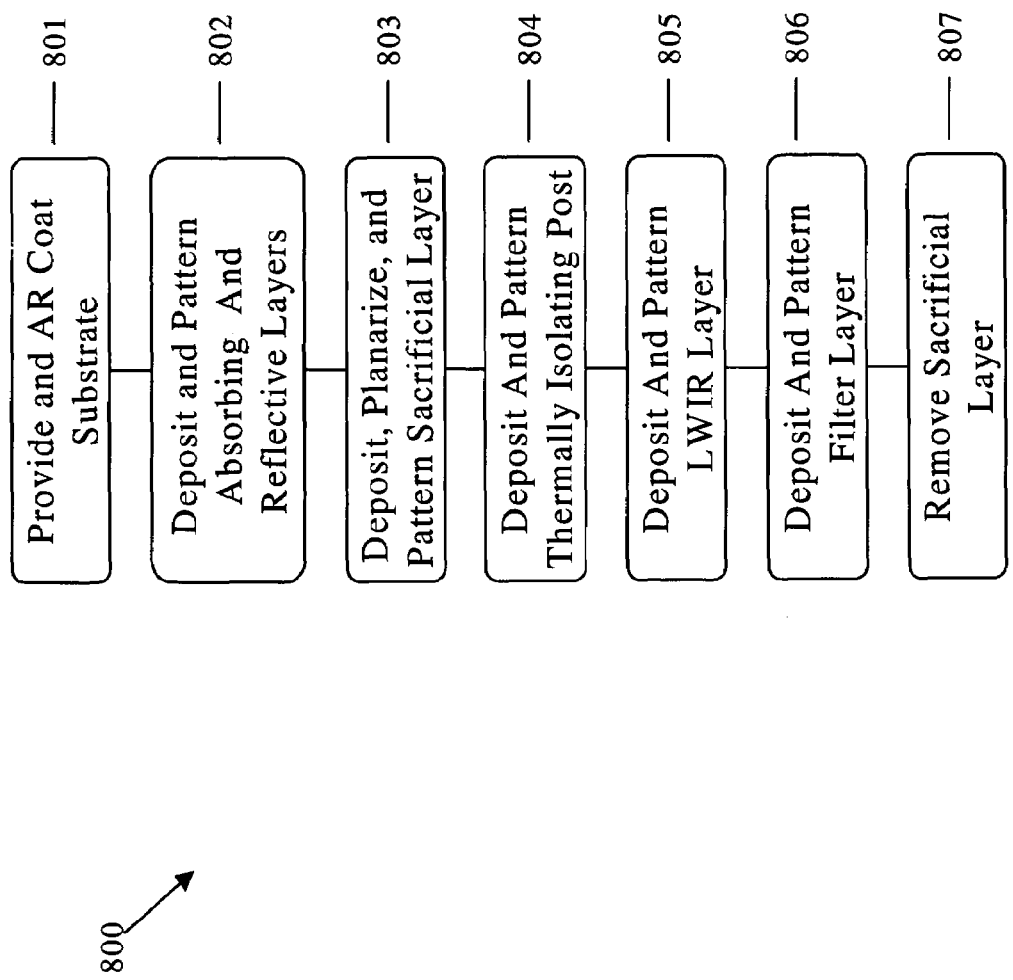
FIG. 8 illustrates a flow chart of a method of making the thermally tunable pixel elements of FIGS. 2A-2B.

FIG. 8 illustrates a flow chart of a method 800 of making the thermally tunable pixel element of FIGS. 2A-2B, which is similar to that of FIGS. 4A-4B and 5A-5B but instead includes the LWIR absorbing structure below the filter islands, and includes a thermally isolating post. Many of the steps are similar to those described above. The first step of the method provides a substrate and coats one side of it with an antireflective (AR) coating (801). The next step deposits absorbing and reflective layers on the other side of the substrate from the AR coating and patterns them (802). This form an aperture that will transmit the carrier beam to the filter islands in the finished structure. The next step deposits, planarizes, and patterns a sacrificial layer (803) over the absorbing and reflective layers. The sacrificial layer forms the space between the substrate and the upper pixel structure, e.g., the filter islands and LWIR structure, and the pattern in the sacrificial layer provides an area for the post. The next step deposits and patterns the thermally isolating post (804). Here, because the post provides thermal isolation to the pixel, a material with low thermal conductivity is used, such as $SiO_2$. The next step deposits and patterns LWIR absorbing structure (805) over the sacrificial layer, separating the pixel from adjacent pixels in the array. The next step deposits and patterns the filter layer (806) over the LWIR absorbing layer, forming the filter islands. The last step removes the sacrificial layer (807) to form the finished pixel. The intermediate structures formed in this fabrication method are similar to those described above, and are therefore not described in greater detail.

Figure 9:
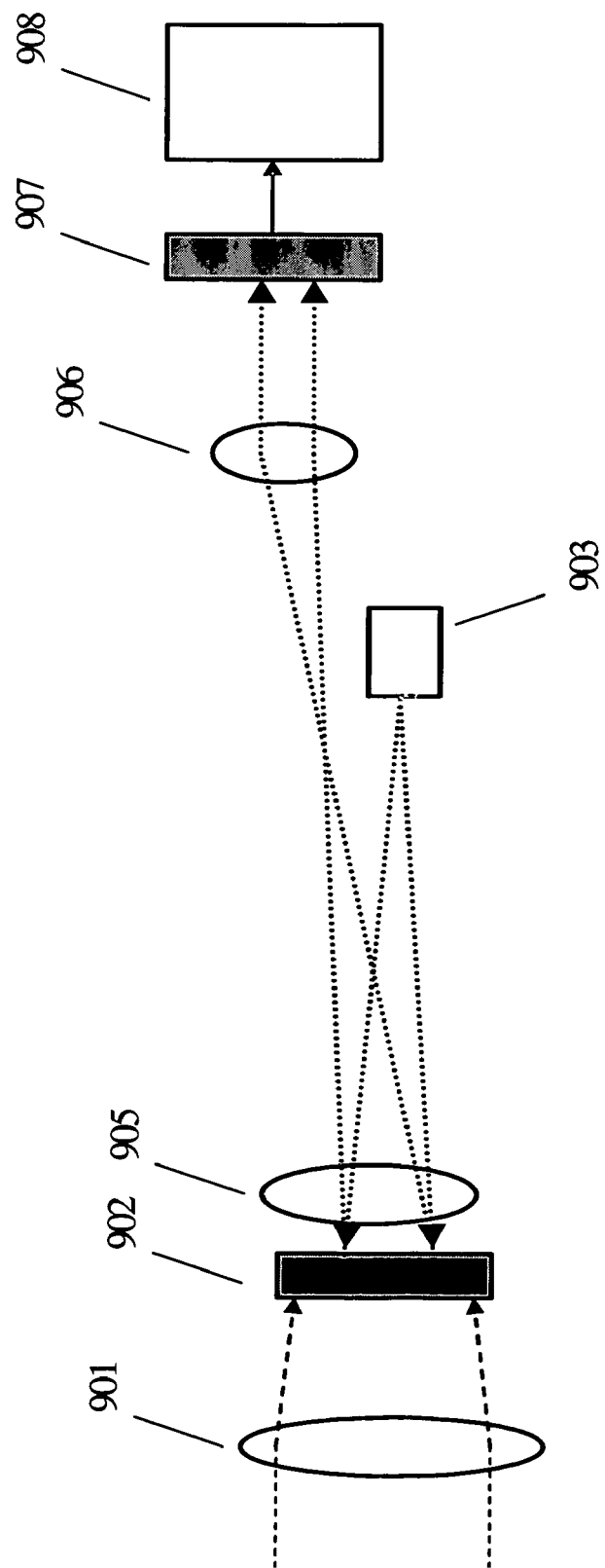
FIG. 9 illustrates another configuration for a reflection-mode thermal imaging system with thermally tunable pixel elements and optical readout.

The reflection-mode system illustrated in FIG. 1 can be modified to provide a similar functionality, but using fewer optics which therefore provides fewer surfaces to generate stray reflections. For example, FIG. 9 illustrates a different kind of reflection-mode system. As for FIG. 1, an LWIR lens 901 images LWIR radiation from a scene onto a TLV sensor array 902. An NIR laser subsystem 903 generates a carrier beam, which is aligned to directly irradiate TLV 902 through lens 905, so that a beamsplitter is not necessary. The carrier beam reflects from TLV 902, and transmits through lens 905. Then, lens 906 images the beam onto CCD sensor array 907. CCD 907 converts the carrier beam to an electrical signal, which hardware and software 908 process to produce an image corresponding to the thermal radiation from the scene.

Figure 10:
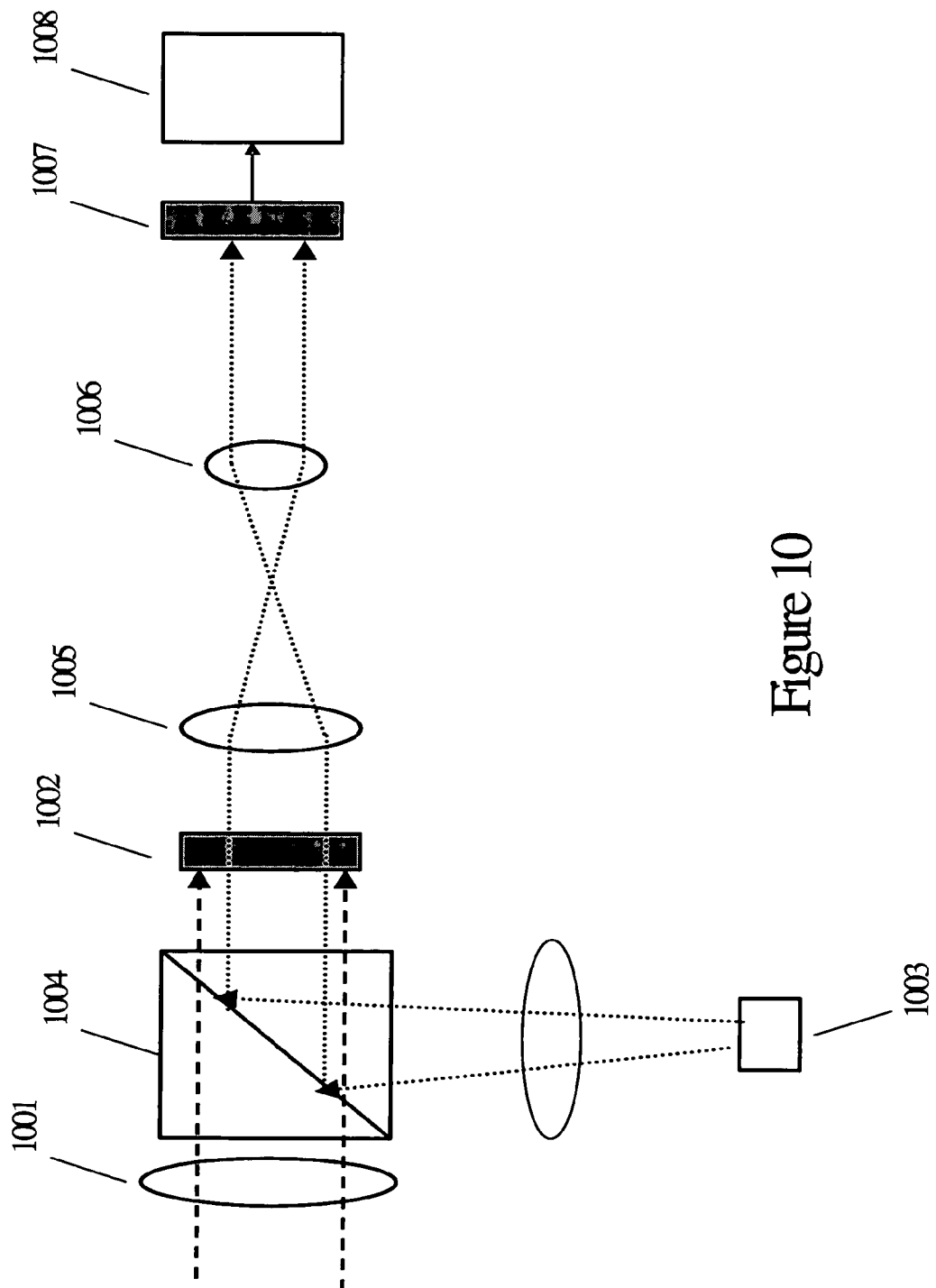
FIG. 10 illustrates a transmission-mode thermal imaging system with thermally tunable pixel elements and optical readout.

FIG. 10 illustrates a transmission-mode system. LWIR lens 1001 images LWIR radiation from a scene onto TLV sensor array 1002, which it heats according to the thermal characteristics of the scene. NIR laser subsystem 1003 generates a carrier beam, which beamsplitter directs to be collinear with the LWIR radiation. The carrier beam transmits through TLV 1002 with a transmission that varies in space according to the local temperature at the TLV. Lens 1005 and lens 1006 image the carrier beam onto CCD detector array 1007, which converts the carrier beam into an electrical signal that hardware and software 1008 process to produce an image of the scene's thermal characteristics.

In this system, the pixels used in TLV sensor array 1002 are similar in many ways to the pixels described above, having separate structures for thermal absorption, structural support, thermal isolation, and carrier beam modulation. In general, the filter islands modulate the carrier beam similarly upon its reflection or its transmission through the island, so that component would not need to be significantly changed.

Note that in the described systems, not all of the light on the CCD carries information about the scene. For example, non-idealities in the antireflection coating on the bottom of the pixel's substrate can generate stray carrier beam reflections that the CCD records but which do not carry information about the scene. Also, for example, the pixels change the intensity of the carrier beam only by about 1 part in 1000, so most of the light in the carrier beam is unmodulated. This unmodulated light forms a large DC background that the system images onto the CCD detector array along with the thermal signal, which can overwhelm the thermal signal as well as generate noise in the CCD. To further improve the signal at the CCD, optical image processing can be used to reduce or eliminate the DC background. For example, lens 105 of FIG. 1 performs a Fourier transform on the carrier beam in a Fourier plane between lens 105 and lens 106. In this Fourier plane, the DC and low-frequency background components are spatially separated from the higher frequency signal components, and can be removed with a spatial filter, as described in greater detail in U.S. Provisional Patent Application Nos. 60/690,593, filed Jun. 15, 2005, and 60/775,463, filed Feb. 21, 2006, the entire contents of which are incorporated herein by reference. For the described pixel architectures, the somewhat complicated structure of 3 filter islands on a hexagonal pixel generates a complicated diffraction pattern in the Fourier plane, the $0^{th}$ order of which contains the DC background. An appropriate corresponding spatial filter blocks the $0^{th}$ diffraction order and allows the other orders to be imaged onto the CCD. Alternately, one or more of the other diffraction orders, e.g., the ±1 orders, can be selected and imaged onto the CCD.

Although the pixel architectures described above have three filter islands per pixel, in general other numbers of filter islands can be used, so long as they sufficiently modulate the carrier beam so the CCD detector array records a usable image of the scene. For example, one, two, four, or more filter islands per pixel can be used. The design of the other structures in the pixel, e.g., the thermally isolating structure(s), can be redesigned accordingly.

Other embodiments are within the following claims.

What is claimed is:

1. A structure comprising:
   a substrate;
   a plurality of thermally tunable filter islands;
   a thermally isolating trench between each filter island of the plurality of filter islands;
   a thermal absorption structure in direct thermal contact with and extending beyond one of the thermally tunable filter islands; and
   a thermal isolation structure providing a thermally isolating path between the thermal absorption structure and the substrate.

2. The structure of claim 1, wherein the thermal absorption structure supports the said one of the filter islands from below.

3. The structure of claim 1, wherein the thermal absorption structure supports the said one of the filter islands from above.

4. The structure of claim 1, wherein the said one of the filter islands has a smaller area than the thermal absorption structure.

5. The structure of claim 1, wherein the thermal isolation structure comprises a support arm for the said one of the thermally tunable filter islands and the thermal absorption structure.

6. The structure of claim 1, wherein the thermal isolation structure comprises a plurality of support arms for the said one of the thermally tunable filter island and thermal absorption structure.

7. The structure of claim 1, wherein the thermal isolation structure comprises a patterned portion of the thermal absorption structure.

8. The structure of claim 1, wherein the thermal isolation structure comprises a thermally isolating post.

9. The structure of claim 1, further including a space between the substrate and the thermal absorption structure.

10. The structure of claim 9, wherein the space has a thickness that is about ¼ of a thermal wavelength of interest.

11. The structure of claim 10, further comprising a patterned reflective layer that reflects at least the thermal wavelength of interest.

12. The structure of claim 1, further comprising a patterned absorbing layer, at least a portion of which absorbs light irradiating the pixel element.

13. The structure of claim 12, wherein the patterned absorbing layer comprises an aperture that transmits light irradiating the pixel element.

14. The structure of claim 1, wherein the thermally tunable filter island comprises a thermally tunable thin film interference filter.

15. The structure of claim 1, wherein the thermal absorbing structure comprises silicon dioxide, silicon nitride, or a mixture thereof.

16. The structure of claim 1, wherein the thermal absorbing structure comprises a thin metal film.

* * * * *